US010920898B2

(12) United States Patent
Miyamoto

(10) Patent No.: US 10,920,898 B2
(45) Date of Patent: Feb. 16, 2021

(54) PIEZO ACTUATOR, FLUID CONTROL VALVE, AND FLUID CONTROL APPARATUS

(71) Applicant: HORIBA STEC, Co., Ltd., Kyoto (JP)

(72) Inventor: Hideaki Miyamoto, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 0 days.

(21) Appl. No.: 16/680,001

(22) Filed: Nov. 11, 2019

(65) Prior Publication Data
US 2020/0166150 A1 May 28, 2020

(30) Foreign Application Priority Data
Nov. 22, 2018 (JP) ................. 2018-219437

(51) Int. Cl.
| | |
|---|---|
| F16K 31/02 | (2006.01) |
| F16K 31/00 | (2006.01) |
| G01R 31/34 | (2020.01) |
| G05D 16/20 | (2006.01) |
| G05D 7/06 | (2006.01) |

(52) U.S. Cl.
CPC .......... *F16K 31/007* (2013.01); *G01R 31/343* (2013.01); *G05D 7/0635* (2013.01); *G05D 16/2013* (2013.01)

(58) Field of Classification Search
CPC .. F16K 31/007; G01R 31/343; G05D 7/0635; G05D 16/2013
USPC ............ 137/494, 487.5; 156/345.15, 345.24, 156/350, 367, 368; 118/684, 715; 251/129.01, 129.06, 318
See application file for complete search history.

(56) References Cited

U.S. PATENT DOCUMENTS

| | | | | |
|---|---|---|---|---|
| 4,529,164 A | * | 7/1985 | Igashira | F02M 59/366 123/472 |
| 5,314,118 A | * | 5/1994 | Lembke | F16K 31/007 137/596.16 |
| 5,520,001 A | * | 5/1996 | Miyamoto | F16K 7/14 62/50.2 |
| 6,062,246 A | * | 5/2000 | Tanaka | G05D 7/0635 137/12 |
| 6,202,670 B1 | * | 3/2001 | O'Neill | F16K 31/007 137/625.5 |
| 7,508,172 B1 | * | 3/2009 | Nishimura | H02P 29/0241 290/40 A |
| 9,709,186 B2 | * | 7/2017 | Zumstrull | F16K 7/12 |

(Continued)

FOREIGN PATENT DOCUMENTS

JP            2010190430 A       9/2010

*Primary Examiner* — Minh Q Le
(74) *Attorney, Agent, or Firm* — Alleman Hall Creasman & Tuttle LLP

(57) ABSTRACT

A piezo actuator is provided which is capable of continuing a provisional operation at least in a limited movable range without bringing an operation to a complete stop even upon occurrence of dielectric breakage. The piezo actuator includes a plurality of piezo blocks and a driving circuit. The piezo blocks are formed by alternately stacking a piezoelectric ceramic layer and an electrode layer. The driving circuit is connected to the piezo blocks. The piezo blocks are arranged in an extension/contraction direction. The driving circuit includes a power source part to which the piezo blocks are individually connected in parallel, and a plurality of limiting resistors respectively disposed in series to the piezo blocks.

7 Claims, 6 Drawing Sheets

(56) References Cited

U.S. PATENT DOCUMENTS

| | | | | |
|---|---|---|---|---|
| 10,400,906 | B2* | 9/2019 | Shirey | F16K 31/086 |
| 2001/0001770 | A1* | 5/2001 | Spangler | A63B 60/54 |
| | | | | 473/221 |
| 2008/0296523 | A1* | 12/2008 | Gianchandani | F16K 99/0005 |
| | | | | 251/129.06 |
| 2009/0173387 | A1* | 7/2009 | DuPuis | F16K 31/007 |
| | | | | 137/1 |
| 2010/0294964 | A1* | 11/2010 | Matsumoto | F16K 7/14 |
| | | | | 251/129.01 |
| 2011/0284779 | A1* | 11/2011 | Cewers | F16K 31/007 |
| | | | | 251/118 |
| 2012/0180876 | A1* | 7/2012 | Hayashi | G01F 1/36 |
| | | | | 137/486 |
| 2014/0076424 | A1* | 3/2014 | Takijiri | G05D 7/0617 |
| | | | | 137/486 |
| 2014/0374634 | A1* | 12/2014 | Ohtsuki | F16K 31/007 |
| | | | | 251/129.06 |
| 2016/0033973 | A1* | 2/2016 | Takijiri | G05D 7/0635 |
| | | | | 137/10 |
| 2017/0102095 | A1* | 4/2017 | Kunita | F16K 37/0091 |
| 2017/0254430 | A1* | 9/2017 | Hirata | H01L 41/0536 |
| 2017/0292622 | A1* | 10/2017 | Hayashi | G05D 7/0635 |
| 2018/0003312 | A1* | 1/2018 | Schupp | F16K 31/007 |
| 2018/0240961 | A1* | 8/2018 | Shigyou | F16K 31/007 |
| 2019/0154164 | A1* | 5/2019 | Mikota | F16K 31/082 |
| 2019/0195381 | A1* | 6/2019 | Jaskiewicz | F16K 31/006 |
| 2019/0271335 | A1* | 9/2019 | Yasuda | F16K 27/0236 |
| 2019/0384330 | A1* | 12/2019 | Ando | G05D 7/0635 |
| 2020/0185588 | A1* | 6/2020 | Hayashi | F16K 31/007 |

* cited by examiner

PIEZO ACTUATOR, FLUID CONTROL VALVE, AND FLUID CONTROL APPARATUS

BACKGROUND OF THE INVENTION

Field of the Invention

The present invention relates to a piezo actuator for use in, for example, a fluid control valve.

Background Art

A mass flow controller is used for controlling flow rates of various kinds of gases supplied into a chamber in semiconductor manufacturing processes. This mass flow controller includes a fluid control valve provided with a piezo actuator. A valve position as the fluid control valve is adjustable under the control of extension/contraction of the piezo actuator. This leads to a desired flow rate.

Meanwhile, the piezo actuator for use in the fluid control valve is formed by stacking a large number of piezo elements for the purpose of increasing displacement (refer to Patent Document 1). The piezo elements are individually connected, for example, in parallel to a power source part and are subjected to an application of an identical voltage.

If dielectric breakdown occurs in one of the piezo elements in the piezo actuator thus configured, the corresponding part may be short-circuited, thus failing to sufficiently apply a voltage necessary for driving the remaining piezo elements. Specifically, the piezo actuator becomes incapable of extending and contracting only due to failure of the single piezo element. The dielectric breakdown of the piezo element occurs suddenly, resulting in a sudden stop of flow rate control during a process in the mass flow controller.

The sudden stop of the flow rate control may cause a serious problem in the semiconductor manufacturing processes. This also makes it difficult for the mass flow controller to resume the flow rate control until completion of replacement of the piezo actuator.

PRIOR ART DOCUMENT

Patent Document

Patent Document 1: Japanese Unexamined Patent Publication No. 2010-190430

SUMMARY OF THE INVENTION

Problems to be Solved by the Invention

The present invention has been made to solve the above problem and has for its main object to provide a piezo actuator whose operation does not stop completely even if dielectric breakdown occurs, thereby making it possible to continue a provisional operation at least in a limited movable range.

Means for Solving the Problems

A piezo actuator in one of embodiments of the present invention includes a plurality of piezo blocks and a driving circuit. The piezo blocks are formed by alternately stacking a piezoelectric ceramic layer and an electrode layer. The driving circuit is connected to the piezo blocks. The piezo blocks are arranged in an extension/contraction direction. The driving circuit includes a power source part to which the piezo blocks are individually connected in parallel, and a plurality of limiting resistors respectively disposed in series to the piezo blocks.

With the above configuration, even if dielectric breakdown occurs in one of the piezo blocks, the limiting resistors are intended to limit a current passing through the piezo block after subjected to the dielectric breakdown, thereby preventing a decrease in voltage supplied to the remaining piezo blocks not subjected to dielectric breakdown.

Consequently, the piezo blocks not subjected to dielectric breakdown can be continuously driven, and a provisional operation can be continued even if a movable range as a piezo actuator is limited. It is therefore possible to prevent a sudden stop of the piezo actuator due to sudden dielectric breakdown. This makes it possible to, for example, carry out a replacement by stopping the piezo actuator after being brought into a state in which no problem occurs due to the stop thereof.

From the above, the piezo actuator in the embodiment of the present invention is capable of satisfying, for example, operational continuity needed for semiconductor manufacturing processes.

In order that even if dielectric breakdown occurs in one of the piezo blocks, the remaining piezo blocks can surely continuously be driven, resistance values of the limiting resistors need to be set so that a value of current passing through the driving circuit upon the occurrence of dielectric breakdown in the piezo blocks does not exceed current supply capability of the power source part.

With a fluid control valve including a piezo actuator in the embodiments of the present invention, and a valve body driven by the piezo actuator and brought into contact with and apart from a valve seat, it is possible to continue control of a fluid even upon the occurrence of dielectric breakdown.

With a fluid control apparatus including a fluid control valve in embodiments of the present invention, a fluid sensor to measure a pressure or flow rate of a fluid, and a valve control section to control a voltage outputted from the power source part so that a measured value measured by the fluid sensor reaches a preset target valve, it is possible to prevent, for example, a sudden stop due to dielectric breakdown during deposition or the like in a semiconductor process. This makes it possible to continue the process by a provisional operation. Consequently, a gas supply can be continued until completion of the deposition, and a replacement of the piezo actuator can be carried out, for example, at the timing of a prescribed set-up change, thereby minimizing the influence on the processes.

In order that the presence or absence of failure of the piezo blocks can be self-checked by utilizing the fact that there occurs no significant change in voltage applied to a normal piezo block even upon the occurrence of dielectric breakdown, the fluid control apparatus needs to include a reference relationship storage section, a voltage monitor, and a failure determination section. The reference relationship storage section is intended to store a reference relationship that is a relationship between a pressure or flow rate of a fluid when the piezo blocks are normal, and a voltage outputted from the power source part. The voltage monitor is intended to detect a voltage outputted from the power source part. The failure determination section is intended to determine the presence or absence of failure in the piezo blocks on the basis of a measured value measured by the fluid sensor or a target value set by a valve control section, a voltage detected by the voltage monitor, and the reference relationship.

In order to keep a large movable range as the entire piezo actuator as much as possible even upon the occurrence of dielectric breakdown in one of the piezo blocks, the piezo blocks need to be identical in length dimension in the extension/contraction direction. A similar effect is obtainable by increasing the number of piezo blocks constituting a piezo actuator, or by increasing a division number of the piezo blocks.

At least one of the piezo blocks need to be different from others in length dimension in the extension/contraction direction in order to achieve more accurate positioning by making the piezo blocks have different resolutions related to extension/contraction, or in order that the failure determination section is capable of determining whether or not failure occurs in any one of the piezo blocks, with a configuration in which a change that appears upon the occurrence of dielectric breakage differs per piezo block.

Effect of the Invention

With the piezo actuator in the embodiments of the present invention, the limiting resistors are respectively disposed in series to the piezo blocks connected in parallel to the power source part. Therefore, even if dielectric breakdown occurs in one of the piezo blocks, it is possible to prevent an excess current from passing through the piezo block subjected to dielectric breakdown. This makes it possible to continue driving within the current supply capability of the power source part even upon the occurrence of dielectric breakdown. Hence, a voltage enough for driving can be applied to the rest normal piezo blocks, and it is therefore possible to continue a provisional operation.

MODE FOR CARRYING OUT THE INVENTION

A piezo actuator 7, and a fluid control valve 3 and a fluid control apparatus 100 each using the piezo actuator 7 in a first embodiment of the present invention are described below with reference to FIGS. 1 to 3.

The fluid control apparatus 100 is a so-called mass flow controller and is usable for controlling, for example, a flow rate of gas supplied to a chamber in the first embodiment. Alternatively, the fluid control apparatus 100 may be intended to control a liquid besides the gas.

Figure 1:
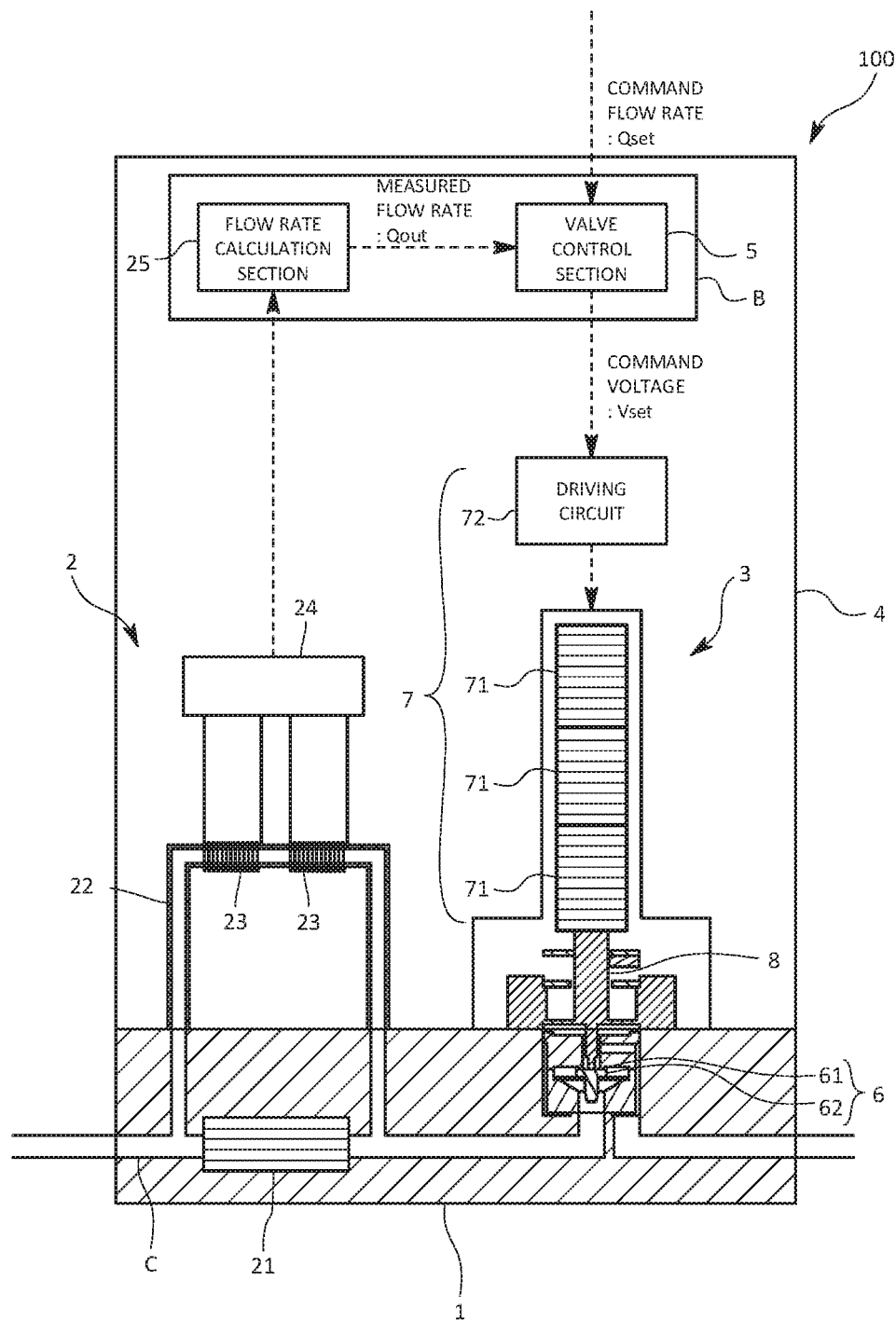
FIG. 1 is a schematic diagram illustrating a piezo actuator, and a fluid control valve and a fluid control apparatus each using the piezo actuator in a first embodiment of the present invention.

As illustrated in FIG. 1, the fluid control apparatus 100 includes a body 1 including a flow path C therein, a flow rate sensor 2, a fluid control valve 3, and a control board B to manage controls or the like. The flow rate sensor 2 and the fluid control valve 3 are attached onto an upper surface of the body 1, and the control board B and a driving circuit 72 are accommodated in a cover to be covered over the upper surface of the body 1. Thus, the fluid control apparatus 100 is one in which a sensor, a controller and an actuator necessary for flow rate control are packaged.

The flow rate sensor 2 is a thermal flow rate sensor and includes a shunting element 21, a capillary 22, two electric coils 23, a detection circuit 24 and a flow rate calculation section 25. The shunting element 21 is disposed in a flow path C. The capillary 22 is branched off from an upstream side of the shunting element 21 and designed to joint to a downstream side of the shunting element 21. The two electric coils 23 are wound around the capillary 22 and are subjected to an application of a voltage so as to be kept at a certain temperature. The detection circuit 24 is intended to detect a difference between voltages respectively applied to the electric coils 23. The flow rate calculation section 25 is intended to calculate a flow rate of gas flowing through the flow path C on the basis of an output of the detection circuit 24. Although the thermal flow rate sensor is employed in the first embodiment, for example, a pressure flow rate sensor may be employed.

The fluid control valve 3 is a piezo valve whose valve position is controlled by an applied voltage. Specifically, the fluid control valve 3 includes a valve mechanism, a piezo actuator 7 and a plunger 8. The valve mechanism is composed of a valve seat 61 and a valve body 62 accommodated in a recess formed on the upper surface of the body 1. The piezo actuator 7 is indented to provide a driving force to change a position of the valve body 62 relative to the valve seat 61. The plunger 8 is intended to establish coupling between the valve mechanism and the piezo actuator 7.

The piezo actuator 7 includes a plurality of piezo blocks 71 formed by alternately stacking a piezoelectric ceramic layer and an electrode layer, and a driving circuit 72 intended to perform voltage driving of the piezo blocks 71.

Each of the piezo blocks 71 is one in which a large number of piezo elements are formed by a pair of electrode layers with the piezoelectric ceramic layer interposed therebetween. Although the piezo blocks 71 are not electrically connected to one another, they are stacked one upon another so as to obtain agreement in direction in which the piezo elements extend and contract. The individual piezo blocks 71 are intended to hold downward the valve body 62 by being designed to extend and contract with respect to a longitudinal direction illustrated in the drawing in the first embodiment. The valve body 62 thus held downward is pressed against the valve seat 61 with the repulsion of a spring upon a decrease in extension of the piezo actuator 7. The piezo actuator 7 is composed of three independent piezo blocks 71 in the first embodiment, and length dimensions of the piezo blocks 71 in the longitudinal direction are set identical to one another. Specifically, the extension/contraction of the piezo blocks 71 with respect to an applied voltage have the same characteristics.

Figure 2:
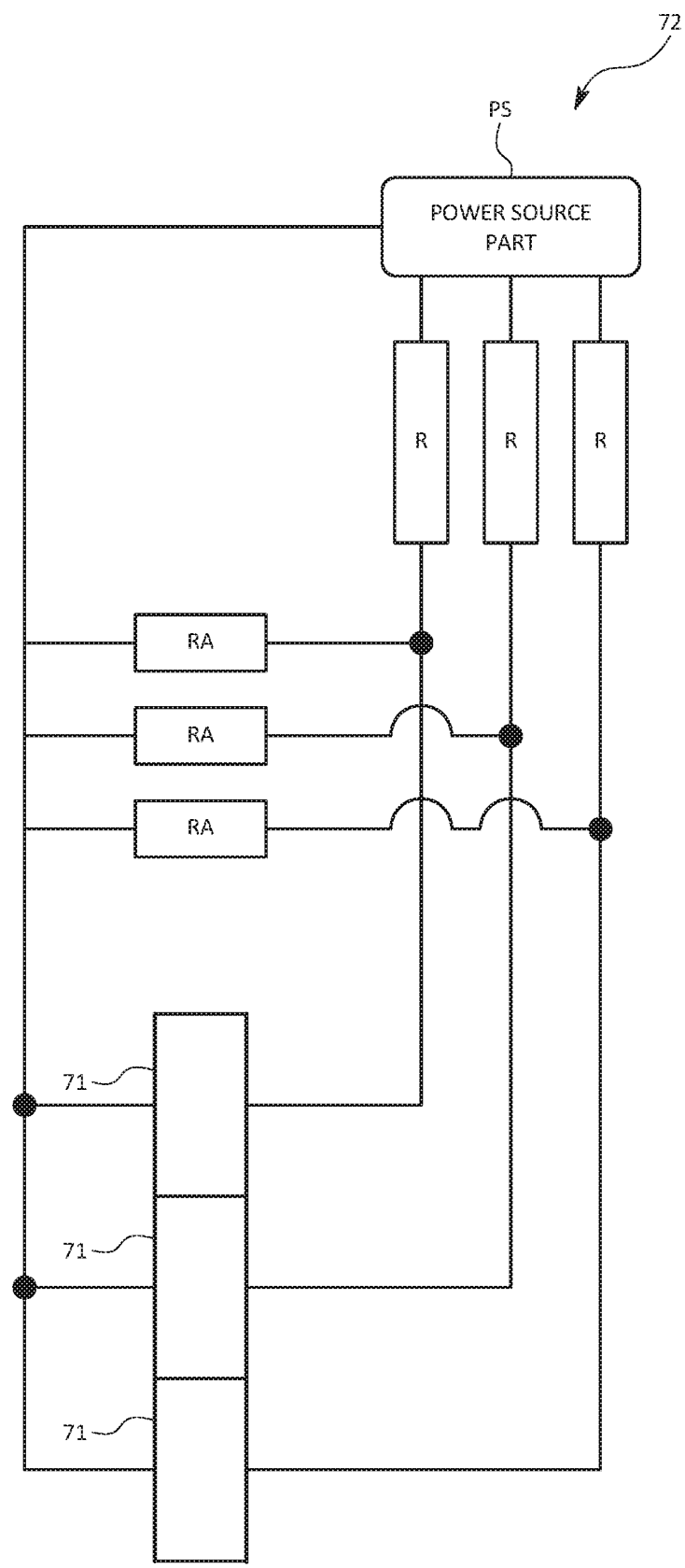
FIG. 2 is a schematic diagram illustrating a circuit configuration of the piezo actuator in the first embodiment.
Figure 3:
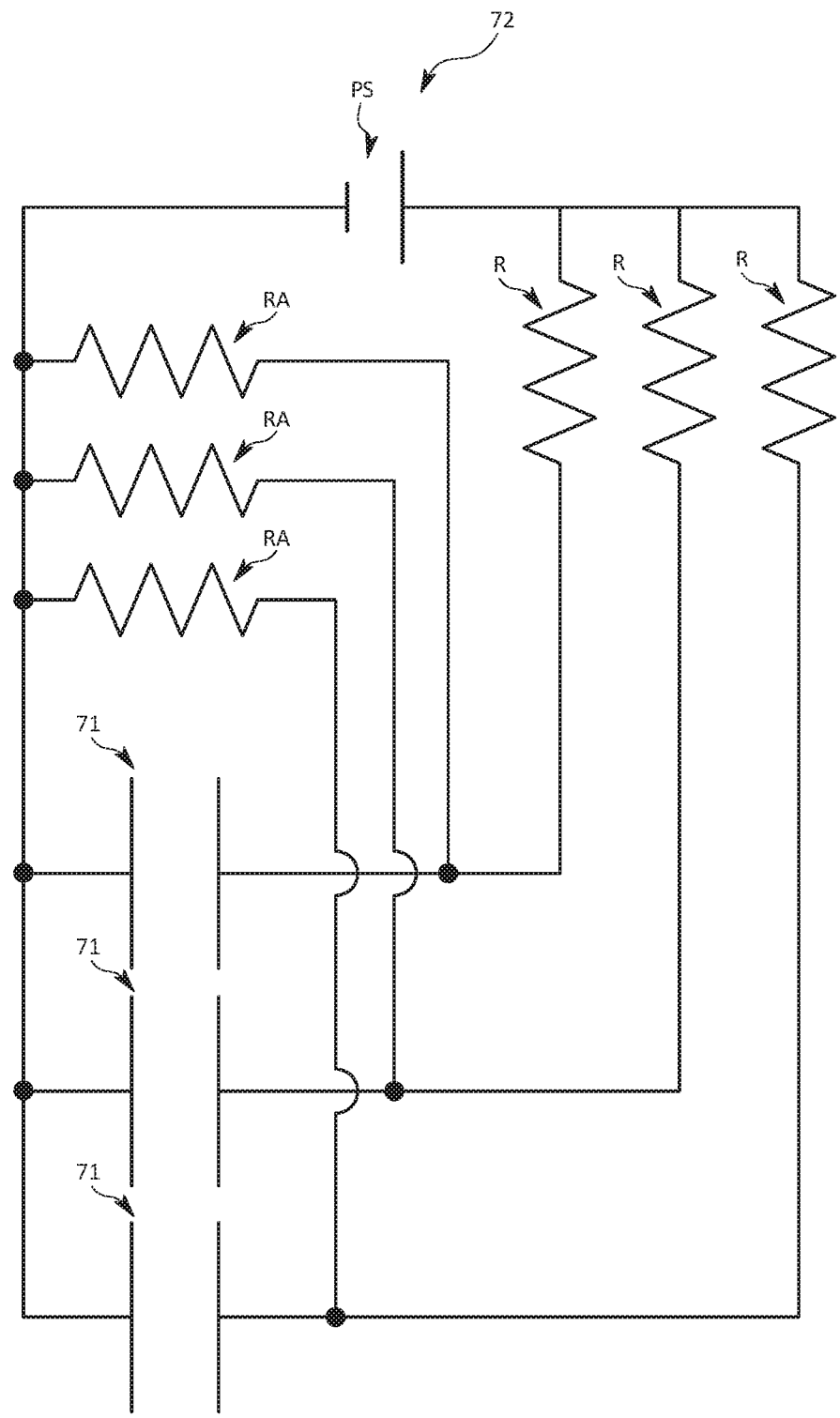
FIG. 3 is a circuit diagram illustrating a circuit configuration of the piezo actuator in the first embodiment.

The driving circuit 72 includes a power source part PS, limiting resistors R and discharge resistors RA as illustrated in FIGS. 2 and 3. The piezo blocks 71 are connected in parallel to the power source part PS. The limiting resistors R are respectively disposed in series to the piezo blocks 71. The discharge resistors RA are intended to respectively release charges stored in the piezo blocks 71. These three limiting resistors R and these three discharge resistors RA are respectively disposed within the three piezo blocks 71 in the present embodiment.

The power source part PS is intended to output a voltage corresponding to a command voltage outputted from the control board B. Because the piezo blocks 71 are connected in parallel to the power source part PS, it follows that an identical voltage is applied thereto if resistance values of the limiting resistors R are identical.

The resistance values of the limiting resistors R are set so that a value of a current passing through the driving circuit 72 upon occurrence of dielectric breakdown in one of the piezo blocks 71 does not exceed current supply capability of the power source part PS. Therefore, even if one of the piezo blocks 71 is subjected to dielectric breakdown and a corresponding part thereof is then short-circuited, it is possible to avoid such a situation where no voltage is applied to the remaining normal piezo blocks 71 due to an excess current flow.

The control board B is a computer including a CPU, a memory, an A/D convertor, a D/A convertor and various kinds of input/output means. The control board B serves as a controller in cooperation with various kinds of devices by execution of a program for a mass flow controller stored in the memory. Specifically, the control board B serves as at least the flow rate calculation section 25 and the valve control section 5 as described above.

The valve control section 5 controls a valve position of the valve 3 on the basis of a command flow rate inputted from outside, and a measured flow rate measured by the flow rate sensor 2. More specifically, the valve control section 5 controls the valve position of the flow rate control valve 3 so as to reduce a deviation between the command flow rate and the measured flow rate. That is, the valve control section 5 performs a PID operation on the deviation between the command flow rate and the measured flow rate, and then outputs a command voltage according to a result thereof to the power source part PS in the driving circuit 72. The power source part PS applies a voltage corresponding to the command voltage being inputted thereto to each of the piezo blocks.

With the fluid control apparatus 100 of the first embodiment thus configured, even if dielectric breakdown occurs in one of the piezo blocks 71 constituting the piezo actuator 7, the limiting resistors R prevent an excess current from passing through the piezo block 71 after subjected to the dielectric breakdown, while a drivable voltage can be supplied to the normal piezo blocks 71.

Hence, even if dielectric breakdown occurs in one of the piezo blocks 71, the piezo blocks 71 may not soon become undrivable. It is however, possible to continue the operation even though a movable range becomes small.

Thus, the fluid control apparatus 100 is capable of continuing flow rate control, for example, in a range of a small flow rate even in the occurrence of dielectric breakdown, thereby preventing an abnormal flow rate of gas from being supplied to the chamber or the like.

Consequently, the fluid control valve 3 using the piezo actuator 7 of the first embodiment is capable of improving reliability during failure as the fluid control apparatus 100, for example, even if the fluid control valve 3 includes the same configurations as a conventional flow rate control valve, except of the configuration of the piezo actuator 7.

Figure 4:
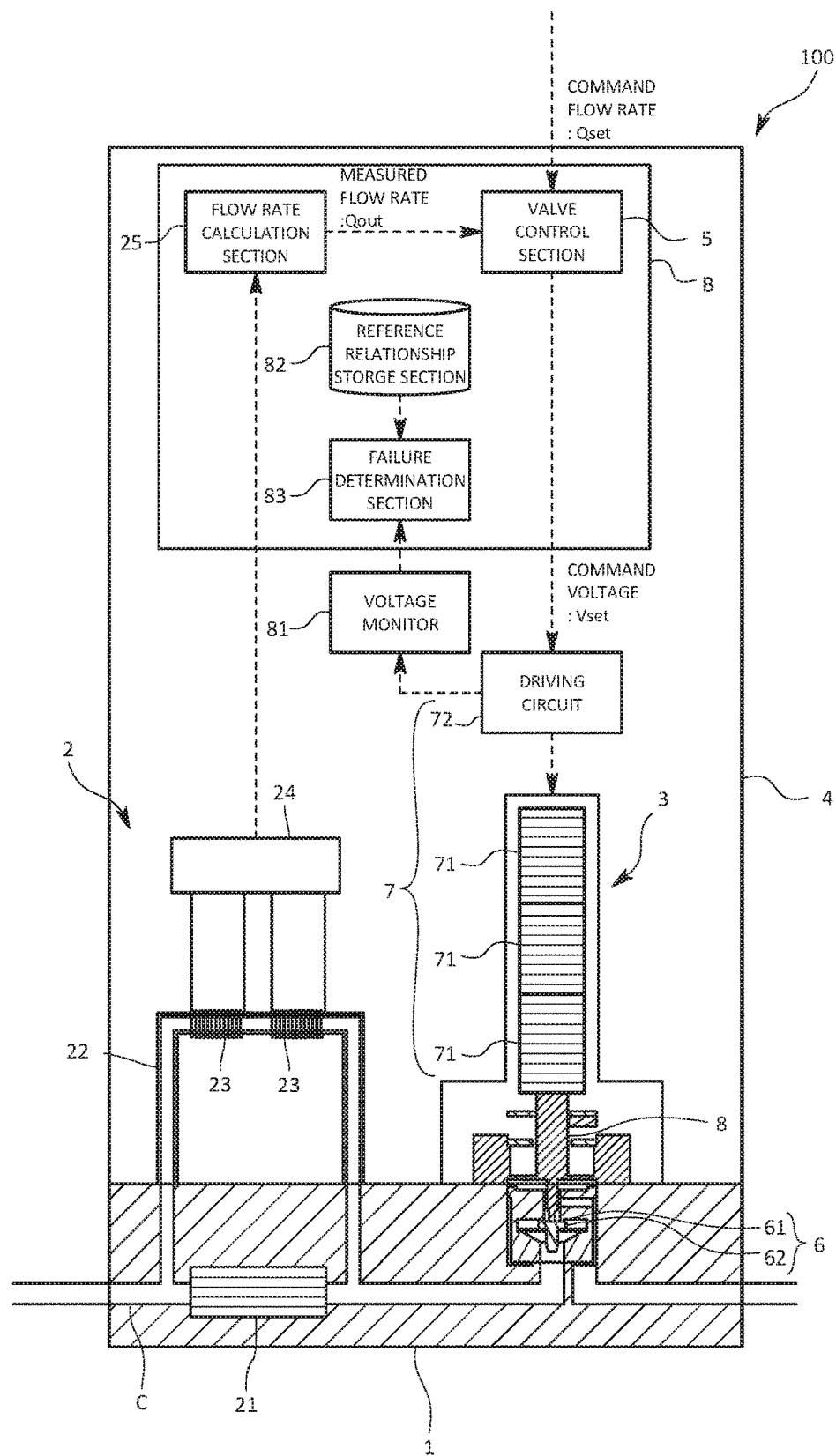
FIG. 4 is a schematic diagram illustrating a piezo actuator, and a fluid control valve and a fluid control apparatus each using the piezo actuator in a second embodiment of the present invention.

A second embodiment of the present invention is described below with reference to FIG. 4.

In comparison with the first embodiment, a fluid control apparatus 100 of the second embodiment further includes the function for determining the presence or absence of failure of the piezo actuator 7 used in the fluid control valve 3.

Specifically, the fluid control apparatus 100 of the second embodiment further includes a voltage monitor 81 for monitoring a voltage being outputted from the power source part PS, a reference relationship storage section 82 whose function is implemented by the control board B, and a failure determination section 83.

The voltage monitor 81 is a voltage detection circuit disposed within, for example, the driving circuit 72, and monitors a voltage being outputted by the power source part PS according to a command voltage. The voltage monitor 81 is intended to detect a voltage being applied to the entirety of the piezo actuator 7, instead of individually detecting voltages being applied to piezo blocks 71.

The reference relationship storage section 82 stores a reference relationship that is a relationship between a flow rate of a fluid when the piezo blocks 71 are normal, and a voltage outputted from the power source part PS when the fluid flows at the flow rate. The reference relationship may be a data table stored in association with the flow rate and the voltage or, alternatively, may be data indicating, for example, a polynomial that indicates a relationship between flow rate and voltage. The phrase that when being normal denotes a state in which the piezo blocks 71 of the fluid control apparatus 100 are performing a desired operation, specifically, a state at a point in time when the fluid control apparatus 100 is subjected to factory shipment. Alternatively, a flow rate obtained after calibrating the fluid control apparatus 100, and a voltage outputted by the power source part PS may be employed as a reference relationship when being normal.

The failure determination section 83 is intended to determine whether or not dielectric breakdown occurs in the piezo blocks 71 on the basis of a measured flow rate measured by the flow rate sensor 2, a voltage detected by the voltage monitor 81, and a reference relationship. Specifically, the failure determination section 83 obtains a reference voltage ought to be outputted from the power source part PS in normal time, on the basis of the measured flow rate and the reference relationship. The failure determination section 83 then compares the reference voltage and a detected voltage being detected by the voltage monitor 81. For example, if a difference between the reference voltage and the detected voltage reaches a predetermined value or more, the failure determination section 83 determines occurrence of failure in one of the piezo blocks 71.

A reason why the above failure determination becomes possible is described below by assuming that dielectric breakdown occurs in one of the piezo blocks 71.

If dielectric breakdown occurs in one of the piezo blocks 71, extension of the entirety of the piezo actuator 7 becomes approximately $2/3$ times that in normal time because lengths in an extension/contraction direction of the piezo blocks 71 are set to be identical to one another. Then, the fluid control apparatus 100 changes a command voltage so as to further apply a voltage because a deviation between a measured flow rate and a command flow rate does not decrease even by applying the same voltage as that in normal time to the piezo actuator 7. That is, in cases where the dielectric breakdown occurs, the fluid control apparatus 100 tries to increase an amount of extension by applying a larger voltage than that in normal time to the piezo blocks 71 in order to obtain the same valve position as that in normal time.

Because the fluid control apparatus 100 operates as described above, the failure determination section 83 is capable of determining whether or not failure occurs in one of the piezo blocks 71 by comparing voltages outputted from the power source part PS in a state in which a fluid flows at a certain flow rate.

Additionally, because the above failure determination can be made, it becomes possible to replace the piezo actuator 7, for example, at the termination of a certain process.

Other embodiments are described below.

Figure 5:
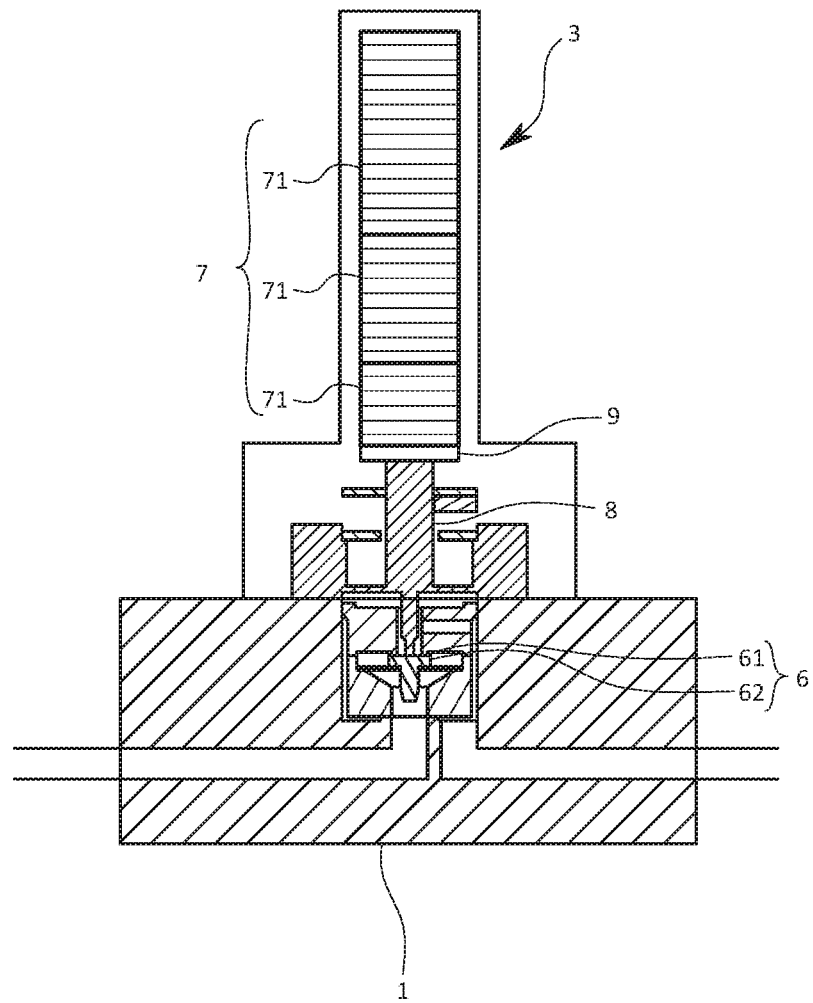
FIG. 5 is a schematic diagram illustrating a fluid control valve in another embodiment of the present invention.

A piezo actuator 7 may be configured so that length dimensions of piezo blocks 71 in their extension/contraction direction are unequal and a part or all of the piezo blocks 71 are different in length dimension as illustrated in FIG. 5. Specifically, the piezo blocks 71 may be configured so as to have different amounts of extension even if an identical voltage is applied thereto. With this configuration, a change in amount of extension of the entirety of the piezo actuator 7 differs depending on which piezo block 71 is subjected to dielectric breakage. It is therefore possible for the failure determination section 83 to determine which piezo block 71 is subjected to failure.

Alternatively, the piezo block 71 whose length dimension is smallest may be disposed at a portion susceptible to deterioration, such as dielectric breakdown, due to exposure to high temperatures, and the piezo block 71 whose length dimension is large may be disposed at a portion not subjected to extremely high temperature as illustrated in FIG. 5. Specifically, the piezo block 71 whose length dimension is smallest may be disposed at a position closest to the valve body 62 brought into contact with high temperature gas or liquid, and the piezo block 71 whose length dimension is large may be disposed at a position furthest from the valve body 62. The influence of reduced extension during failure can be minimized by decreasing the length dimension of the piezo block 71 at a portion that tends to be exposed to high temperatures and is susceptible to failure as described above.

For the purpose of enhancing resistance to high temperatures, a spacer 9 having thermal insulation property, such as a resin material, may be disposed at a portion whose distance to high temperature environment is smallest in the stacked piezo blocks 71. Specifically, the spacer 9 may be disposed at a side of the valve body 62 of the piezo block 71 located closest to a side of the valve body 62 in order to prevent deterioration of the piezo block 71 from proceeding due to heat, such as gas.

Figure 6:
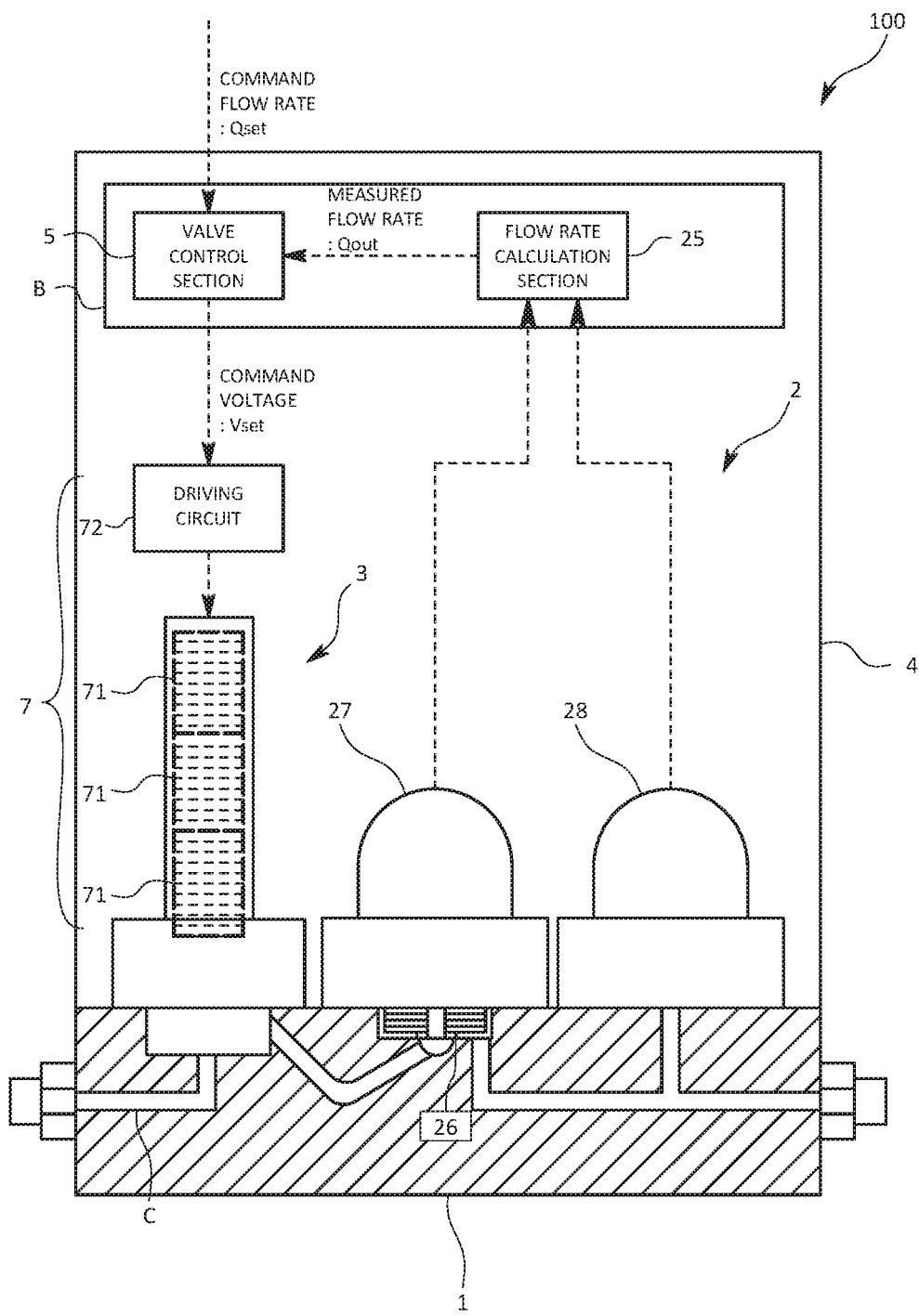
FIG. 6 is a schematic diagram illustrating a fluid control apparatus in still another embodiment of the present invention.

The fluid control valve and the fluid control apparatus may be used not only for controlling a flow rate of a fluid but also for controlling a pressure of the fluid. Although the first embodiment has described, as the fluid control apparatus 100, the thermal mass flow controller using the thermal flow rate sensor, the present invention can also be configured as a pressure mass flow controller using a pressure flow rate sensor as illustrated in FIG. 6. Specifically, the fluid control apparatus 100 in FIG. 6 includes a pressure flow rate sensor 2 disposed downstream of a valve 2 mounting thereon a piezo actuator 7 including a plurality of piezo blocks 71. The flow rate sensor 2 includes a laminar flow element 26 disposed in an internal flow path C, and an upstream pressure sensor 27 and a downstream pressure sensor 28 respectively disposed upstream and downstream of the laminar flow element 26. A flow rate calculation section 25 calculates a flow rate on the basis of upstream and downstream pressures of the laminar flow element 26 respectively measured by the pressure sensors 27 and 28. That is, the flow rate calculation section 25 accepts signals respectively indicating an upstream pressure and a downstream pressure from the pressure sensors 27 and 28, and calculates a flow rate value of a fluid passing through the internal flow path C on the basis of a well-known arithmetic expression from pressure values indicated by these signals.

A failure determination section may be configured to determine failure of the piezo actuator on the basis of a command flow rate that is a target value and a detected voltage, instead of a measured flow rate that is a measured value.

Limiting resistors and discharge resistors may be disposed within a circuit constituting a power source part, instead of being disposed on a connection line that establishes a connection between the power source part and the piezo blocks. Specifically, the limiting resistors need to have the relation of in-series arrangement with the piezo blocks. The discharge resistor needs to have the relation of in-parallel arrangement with the piezo blocks.

Besides the above, a part of one of various modifications may be combined with a part of another embodiment or, alternatively may be modified without departing from the spirit and scope of the present invention.

DESCRIPTION OF THE REFERENCE CHARACTERS 100 fluid control apparatus
1 body
2 flow rate sensor
3 fluid control valve
4 casing
5 valve control section
61 valve seat
62 valve body
7 piezo actuator
71 piezo block
72 driving circuit
PS power source part
R limiting resistor

What is claimed is:

1. A piezo actuator, comprising:
a plurality of piezo blocks formed by alternately stacking a piezoelectric ceramic layer and an electrode layer; and
a driving circuit being connected to the piezo blocks, wherein
the piezo blocks are arranged in an extension/contraction direction, and
the driving circuit comprises
a power source part to which the piezo blocks are individually connected in parallel, and
a plurality of limiting resistors respectively disposed in series to the piezo blocks.

2. The piezo actuator according to claim 1, wherein resistance values of the limiting resistors are set so that a value of a current passing through the driving circuit upon occurrence of dielectric breakdown in the piezo blocks does not exceed current supply capability of the power source part.

3. A fluid control valve, comprising:
the piezo actuator according to claim 1; and
a valve body driven by the piezo actuator and brought into contact with and apart from a valve seat.

4. A fluid control apparatus, comprising:
the fluid control valve according to claim 3;
a fluid sensor to measure a pressure or flow rate of a fluid; and
a valve control section to control a voltage outputted from the power source part so that a measured value measured by the fluid sensor reaches a preset target value.

5. The fluid control apparatus according to claim 4, further comprising:
- a reference relationship storage section to store therein a reference relationship that is a relationship between a pressure or flow rate of a fluid when the piezo blocks are normal, and a voltage outputted from the power source part;
- a voltage monitor to detect a voltage outputted from the power source part; and
- a failure determination section to determine presence or absence of failure in the piezo blocks on a basis of a measured value measured by the fluid sensor or a target value set by a valve control section, a voltage detected by the voltage monitor, and the reference relationship.

6. The fluid control apparatus according to claim 5, wherein the piezo blocks are identical in length dimension in the extension/contraction direction.

7. The fluid control apparatus according to claim 5, wherein at least one of the piezo blocks is different from others in length dimension in the extension/contraction direction.

\* \* \* \* \*